(12) United States Patent
Shikauchi et al.

(10) Patent No.: US 10,410,978 B2
(45) Date of Patent: Sep. 10, 2019

(54) SEMICONDUCTOR WAFER AND METHOD FOR FORMING SEMICONDUCTOR

(71) Applicant: Sanken Electric Co., Ltd., Saitama (JP)

(72) Inventors: Hiroshi Shikauchi, Saitama (JP); Tomonori Hotate, Saitama (JP); Yuki Tanaka, Saitama (JP); Shinji Kudoh, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 15/878,705

(22) Filed: Jan. 24, 2018

(65) Prior Publication Data
US 2019/0229069 A1    Jul. 25, 2019

(51) Int. Cl.
| | |
|---|---|
| *H01L 21/78* | (2006.01) |
| *H01L 23/00* | (2006.01) |
| *H01L 29/16* | (2006.01) |
| *H01L 23/528* | (2006.01) |
| *H01L 21/762* | (2006.01) |
| *H01L 21/304* | (2006.01) |
| *H01L 21/683* | (2006.01) |
| *H01L 29/06* | (2006.01) |

(52) U.S. Cl.
CPC .......... *H01L 23/562* (2013.01); *H01L 21/304* (2013.01); *H01L 21/6836* (2013.01); *H01L 21/76224* (2013.01); *H01L 21/78* (2013.01); *H01L 23/528* (2013.01); *H01L 29/0649* (2013.01); *H01L 29/16* (2013.01); *H01L 29/1608* (2013.01)

(58) Field of Classification Search
CPC .............................. H01L 21/78; H01L 23/562
See application file for complete search history.

(56) References Cited

U.S. PATENT DOCUMENTS

| | | | |
|---|---|---|---|
| 2016/0090297 A1* | 3/2016 | Zhang | B81B 7/0048 257/417 |
| 2017/0069578 A1 | 3/2017 | Montgomery | |

* cited by examiner

*Primary Examiner* — Thomas L Dickey
(74) *Attorney, Agent, or Firm* — Harness, Dickey & Pierce, P.L.C.

(57) ABSTRACT

A semiconductor wafer and a method for forming a semiconductor. The semiconductor wafer includes: a first semiconductor component having a first device; a second semiconductor component having a second device; an insulation layer laterally extending to the first semiconductor component and the second semiconductor component; and a grind layer configured on or adjacent to a backside of the semiconductor wafer. Therefore, chipping or cracking can be decreased or avoided when the grind layer is exposed during the thinning process (such as backside grinding).

16 Claims, 5 Drawing Sheets

SEMICONDUCTOR WAFER AND METHOD FOR FORMING SEMICONDUCTOR

TECHNICAL FIELD

Embodiments of the present disclosure generally relate to the field of semiconductors, and more particularly, to a semiconductor wafer and a method for forming a semiconductor.

BACKGROUND

A semiconductor device (or may be referred to as a semiconductor element, component, apparatus, and so on) may include a semiconductor body and one or more electrodes. For example, materials mainly used in the semiconductor body may be silicon or silicon carbide (SiC).

The semiconductor device may be, for instance, a diode or a transistor such as an IGFET (Insulated Gate Field Effect Transistor), a MOSFET (Metal Oxide Semiconductor Field Effect Transistor) or an IGBT (Insulated Gate Bipolar Transistor), and so on.

In general, during a production of the semiconductor device, a plurality of semiconductor devices may be fabricated in a semiconductor wafer, street trenches are formed within the semiconductor wafer and between some or all of the semiconductor devices. Then a dielectric skeleton structure is formed and at least partially covers at least some of the semiconductor devices while substantially filling the street trenches.

Then the semiconductor wafer can be thinned, using the dielectric skeleton structure for mechanical support and stabilization. Thinning proceeds until the dielectric skeleton structure is exposed at a backside of the thinned semiconductor wafer, resulting in formation of multiple ultra-thin semiconductor components each including at least one of the semiconductor devices in the semiconductor wafer.

Then the ultra-thin semiconductor components may be separated by cutting through the dielectric skeleton structure, rather than by cutting through the semiconductor material of the semiconductor wafer.

Reference document 1: US2017/0069578A1.

This section introduces aspects that may facilitate a better understanding of the disclosure. Accordingly, the statements of this section are to be read in this light and are not to be understood as admissions about what is in the prior art or what is not in the prior art.

SUMMARY

However, the inventor found that material of the dielectric skeleton structure in general includes at least one of silicon dioxide (SiO) and silicon nitride (SiN), and the dielectric skeleton structure is fragile (or easily broken). Therefore, chipping or cracking may occur when the dielectric skeleton structure is exposed during the thinning process (such as backside grinding).

In order to solve at least part of the above problems, methods, apparatus, devices are provided in the present disclosure. Features and advantages of embodiments of the present disclosure will also be understood from the following description of specific embodiments when read in conjunction with the accompanying drawings, which illustrate, by way of example, the principles of embodiments of the present disclosure.

In general, embodiments of the present disclosure provide a semiconductor wafer and a method for forming a semiconductor. It is expected to avoid chipping or cracking during the thinning process in this disclosure.

In a first aspect, a semiconductor wafer is provided. The semiconductor wafer includes: a first semiconductor component having a first device; a second semiconductor component having a second device; an insulation layer laterally extending to the first semiconductor component and the second semiconductor component; and a grind layer configured on or adjacent to a backside of the semiconductor wafer; the grind layer contacts a first sidewall of the first semiconductor component and a second sidewall of the second semiconductor component.

In one embodiment, the insulation layer covers at least part of the first sidewall of the first semiconductor component and at least part of the second sidewall of the second semiconductor component.

In one embodiment, the semiconductor wafer further includes: a trench formed between the first semiconductor component and the second semiconductor component; the grind layer and at least part of the insulation layer are configured in the trench.

In one embodiment, material of the grind layer is softer than the material of the first semiconductor component and/or the second semiconductor component.

In one embodiment, the grind layer includes polycrystalline material of the first semiconductor component and/or the second semiconductor component.

In one embodiment, the first semiconductor component and/or the second semiconductor component include silicon, and the grind layer includes polycrystalline silicon.

In one embodiment, the first semiconductor component and/or the second semiconductor component include silicon carbide, and the grind layer includes polycrystalline silicon carbide.

In one embodiment, the semiconductor wafer further includes: a backside metallization layer situated under the semiconductor wafer.

In one embodiment, the semiconductor wafer further includes: a dicing tape situated under the semiconductor wafer.

In one embodiment, the insulation layer includes at least one of silicon dioxide and silicon nitride.

In a second aspect, a semiconductor device is provided; the semiconductor device includes: a semiconductor body; and a grind layer formed on a bottom part of a first sidewall of the semiconductor body; and an insulation layer formed on another part of the first sidewall of the semiconductor body.

In one embodiment, the grind layer and the insulation layer surround the periphery of the semiconductor body.

In a third aspect, a method for forming a semiconductor is provided; the method includes: fabricating a plurality of devices including a first device and a second device in a semiconductor wafer; forming a trench within the semiconductor wafer and between the first device and the second device; forming a grind layer within the trench and on or adjacent to a backside of the semiconductor wafer; and forming an insulation layer within the trench and on the grind layer.

In one embodiment, the method further includes: thinning the semiconductor wafer from the backside to expose the grind layer in the trench to form a first semiconductor component including the first device and a second semiconductor component including the second device.

In one embodiment, the method further includes: providing a backside metallization layer under the semiconductor wafer.

In one embodiment, the method further includes: providing a dicing tape under the semiconductor wafer.

In one embodiment, the method further includes: cutting through the insulation layer and the grind layer to separate the first semiconductor component and the second semiconductor component.

According to various embodiments of the present disclosure, a grind layer is configured on or adjacent to a backside of the semiconductor wafer; and the grind layer contacts a first sidewall of the first semiconductor component and a second sidewall of the second semiconductor component. Therefore, chipping or cracking can be decreased or avoided when the grind layer is exposed during the thinning process (such as backside grinding).

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which.

DETAILED DESCRIPTION

The present disclosure will now be described with reference to several example embodiments. It should be understood that these embodiments are discussed only for the purpose of enabling those skilled persons in the art to better understand and thus implement the present disclosure, rather than suggesting any limitations on the scope of the present disclosure.

It should be understood that when an element is referred to as being "connected" or "coupled" or "contacted" to another element, it may be directly connected or coupled or contacted to the other element or intervening elements may be present. In contrast, when an element is referred to as being "directly connected" or "directly coupled" or "directly contacted" to another element, there are no intervening elements present. Other words used to describe the relationship between elements should be interpreted in a like fashion (e.g., "between" versus "directly between", "adjacent" versus "directly adjacent", etc.).

As used herein, the terms "first" and "second" refer to different elements. The singular forms "a" and "an" are intended to include the plural forms as well, unless the context clearly indicates otherwise. The terms "comprises," "comprising," "has," "having," "includes" and/or "including" as used herein, specify the presence of stated features, elements, and/or components and the like, but do not preclude the presence or addition of one or more other features, elements, components and/or combinations thereof.

The term "based on" is to be read as "based at least in part on". The term "cover" is to be read as "at least in part cover". The term "one embodiment" and "an embodiment" are to be read as "at least one embodiment". The term "another embodiment" is to be read as "at least one other embodiment". Other definitions, explicit and implicit, may be included below.

In this disclosure, unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

A First Aspect of Embodiments

A semiconductor wafer is provided in those embodiments.

Figure 1:
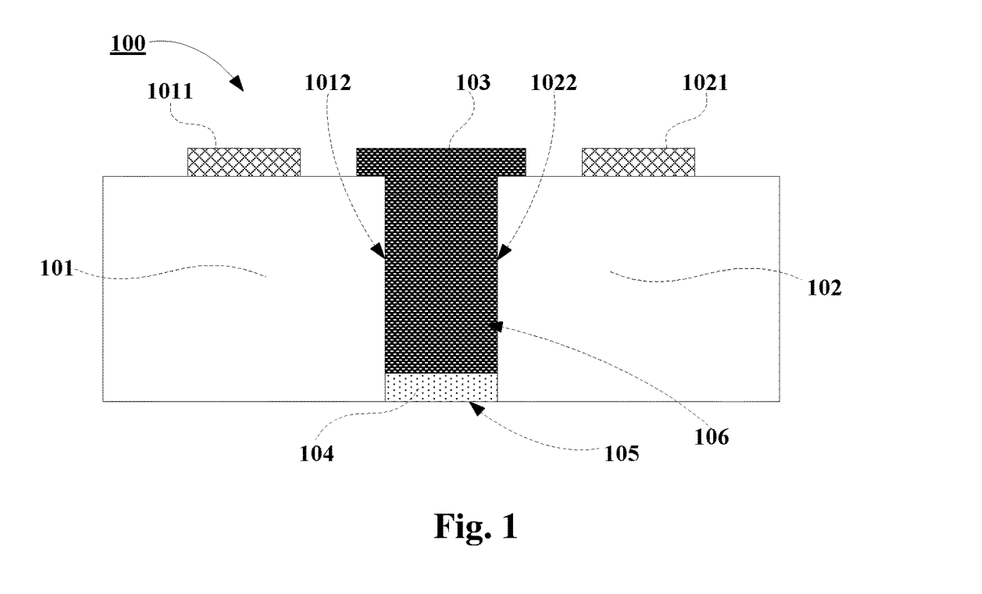
FIG. 1 is a diagram which shows a schematic illustration of a cross-section of a semiconductor wafer 100 in accordance with an embodiment of the present disclosure.

FIG. 1 is a diagram which shows a schematic illustration of a cross-section of a semiconductor wafer 100 in accordance with an embodiment of the present disclosure. As shown in FIG. 1, the semiconductor wafer 100 includes: a first semiconductor component 101 having a first device 1011; and a second semiconductor component 102 having a second device 1021.

As shown in FIG. 1, the semiconductor wafer 100 further includes an insulation layer 103 laterally extending to the first semiconductor component 101 and the second semiconductor component 102. The insulation layer 103 covers at least part of the first sidewall 1012 of the first semiconductor component 101 and at least part of the second sidewall 1022 of the second semiconductor component 102.

As shown in FIG. 1, the semiconductor wafer 100 further includes a grind layer 104 configured on or adjacent to a backside 105 of the semiconductor wafer 100; and the grind layer 104 contacts the first sidewall 1012 of the first semiconductor component 101 and the second sidewall 1022 of the second semiconductor component 102.

As shown in FIG. 1, the semiconductor wafer 100 further includes a trench 106 formed between the first semiconductor component 101 and the second semiconductor component 102; and the grind layer 104 and at least part of the insulation layer 103 are configured in the trench 106.

It should be appreciated that silicon or another material may be mainly used in the semiconductor component (such as the first device 1011 and/or the second device 1021). However, it is not limited thereto, for example, semiconductor material with a larger band gap may also be used. In this disclosure, silicon or silicon carbide may be used as examples of the material of the semiconductor component.

In an embodiment, material of the grind layer 104 is softer than the material of the first semiconductor component 101 and/or the second semiconductor component 102. For example, a hardness of the grind layer 104 is lower than the hardness of the first semiconductor component 101 and/or the second semiconductor component 102. Therefore, chipping or cracking can be decreased or avoided when the grind layer 104 is exposed during the thinning process (such as backside grinding).

In an embodiment, the grind layer 104 may include polycrystalline material of the first semiconductor component 101 and/or the second semiconductor component 102. The material of the first semiconductor component 101 and/or the second semiconductor component 102 may be silicon, or other group IV semiconductor material.

For example, the first semiconductor component 101 and/or the second semiconductor component 102 include silicon, and the grind layer 104 includes polycrystalline silicon (Poly-Si). For another example, the first semiconductor component 101 and/or the second semiconductor component 102 include silicon carbide, and the grind layer 104 includes polycrystalline silicon carbide (Poly-SiC). However, the material of the grind layer 104 is not limited thereto.

Therefore, the grind layer has the substantially same material as the semiconductor component. chipping or cracking can be decreased or avoided when the grind layer 104 is exposed during the thinning process (such as backside grinding).

Furthermore, compared to the semiconductor wafer with the dielectric skeleton structure, grinding speed may not be different for the grind layer and the semiconductor component, such that better buffering can be provided and the semiconductor component may not be affected.

Figure 2:
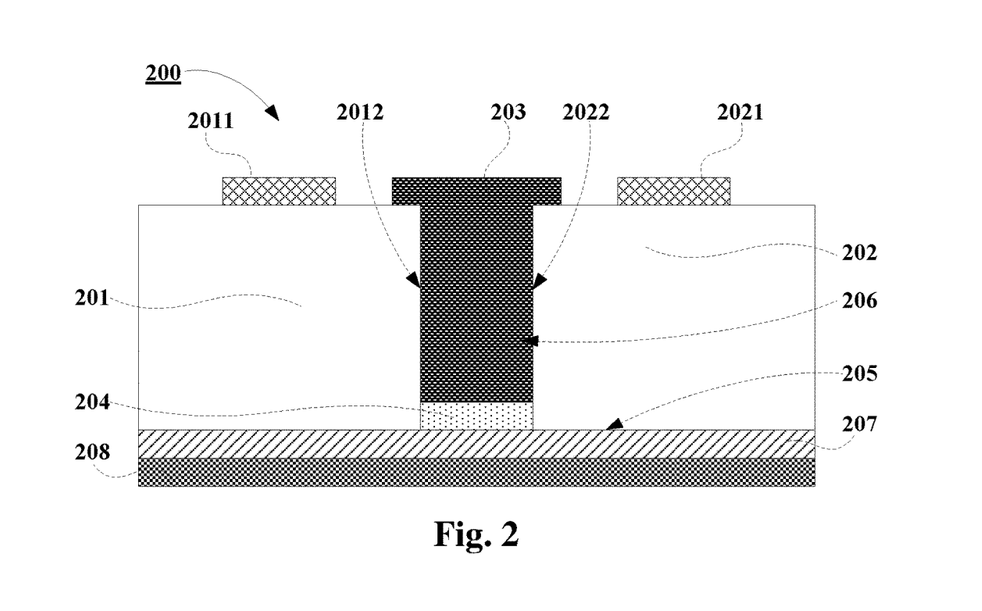
FIG. 2 is a diagram which shows a schematic illustration of a cross-section of a semiconductor wafer 200 in accordance with an embodiment of the present disclosure.

FIG. 2 is another diagram which shows a schematic illustration of a cross-section of a semiconductor wafer 200 in accordance with an embodiment of the present disclosure. As shown in FIG. 2, the semiconductor wafer 200 includes: a first semiconductor component 201 having a first device 2011; and a second semiconductor component 202 having a second device 2021.

As shown in FIG. 2, the semiconductor wafer 200 further includes an insulation layer 203 laterally extending to the first semiconductor component 201 and the second semiconductor component 202. The insulation layer 203 covers at least part of the first sidewall 2012 of the first semiconductor component 201 and at least part of the second sidewall 2022 of the second semiconductor component 202.

As shown in FIG. 2, the semiconductor wafer 200 further includes a grind layer 204 configured on or adjacent to a backside 205 of the semiconductor wafer 200; and the grind layer 204 contacts the first sidewall 2012 of the first semiconductor component 201 and the second sidewall 2022 of the second semiconductor component 202.

As shown in FIG. 2, the semiconductor wafer 200 further includes a trench 206 formed between the first semiconductor component 201 and the second semiconductor component 202; and the grind layer 204 and at least part of the insulation layer 203 are configured in the trench 206.

In an embodiment, the insulation layer 203 includes at least one of silicon dioxide and silicon nitride. The first device 2011 and/or the second device 2021 may be, for instance, a diode or a transistor such as an IGFET (Insulated Gate Field Effect Transistor), a MOSFET (Metal Oxide Semiconductor Field Effect Transistor) or an IGBT (Insulated Gate Bipolar Transistor), and so on.

As shown in FIG. 2, the semiconductor wafer 200 may further include a backside metallization layer 207 situated under the semiconductor wafer 200.

As shown in FIG. 2, the semiconductor wafer 200 may further include a dicing tape 208 situated under the semiconductor wafer 200.

In an embodiment, material of the grind layer 204 is softer than the material of the first semiconductor component 201 and/or the second semiconductor component 202.

In an embodiment, the grind layer 204 may include polycrystalline material of the first semiconductor component 201 and/or the second semiconductor component 202. For example, the first semiconductor component 201 and/or the second semiconductor component 202 include silicon, and the grind layer 204 includes polycrystalline silicon (Poly-Si). For another example, the first semiconductor component 201 and/or the second semiconductor component 202 include silicon carbide, and the grind layer 204 includes polycrystalline silicon carbide (Poly-SiC). However, the material of the grind layer 204 is not limited thereto.

It is to be understood that, the above examples or embodiments are discussed for illustration, rather than limitation. Those skilled in the art would appreciate that there may be many other embodiments or examples within the scope of the present disclosure.

In an embodiment, a semiconductor device is provided. The semiconductor device may include: a semiconductor body; and a grind layer formed on a bottom part of a first sidewall of the semiconductor body; and an insulation layer formed on another part of the first sidewall of the semiconductor body. The grind layer and the insulation layer may surround the periphery of the semiconductor body.

For example, although the above explanation is made by using an example where one trench 106 is simply formed between the first semiconductor component 101 and the second semiconductor component 102, a plurality of trenches may extend on the semiconductor 100 in a first direction and/or a second direction which is orthogonal direction to the first direction. Therefore, the grind layer 104 and the insulation layer 103 are also configured in the other three sides of the first device other than the first side wall. In other words, the grind layer 104 and the insulation layer 103 may surround the periphery of the first device.

As can be seen from the above embodiments, a grind layer is configured on or adjacent to a backside of the semiconductor wafer; and the grind layer contacts a first sidewall of the first semiconductor component and a second sidewall of the second semiconductor component. Therefore, chipping or cracking can be decreased or avoided when the grind layer is exposed during the thinning process (such as backside grinding).

A Second Aspect of Embodiments

A method for forming a semiconductor is provided in these embodiments. The semiconductor wafer is illustrated in the first aspect of embodiments, and the same contents as those in the first aspect of embodiments are omitted.

Figure 3:
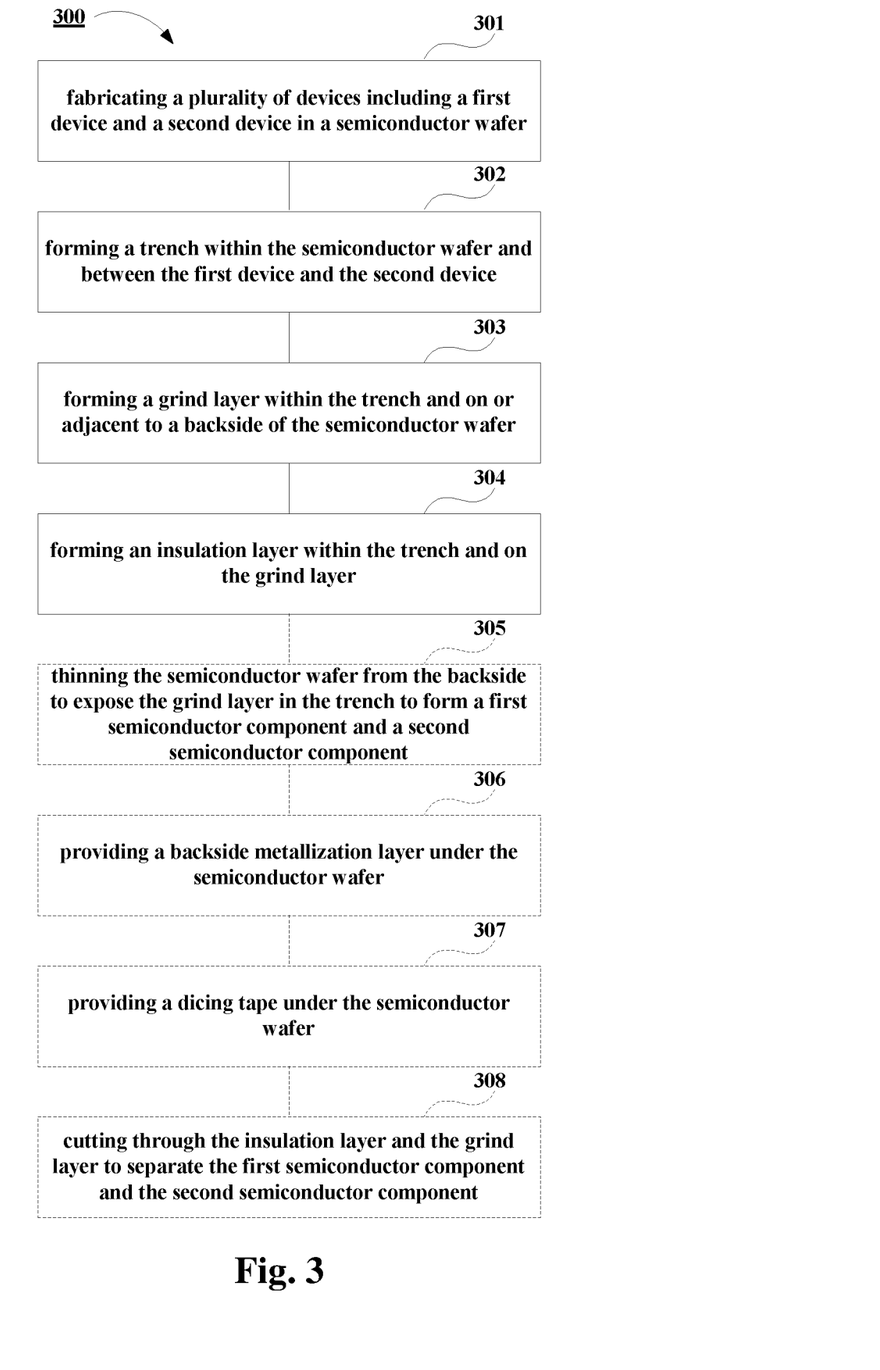
FIG. 3 is a diagram which shows a method 300 for forming a semiconductor in accordance with an embodiment of the present disclosure.

FIG. 3 is a diagram which shows a method for forming a semiconductor in accordance with an embodiment of the present disclosure. As shown in FIG. 3, the method 300 includes:

Block 301, fabricating a plurality of devices including a first device and a second device in a semiconductor wafer.

Figure 4:
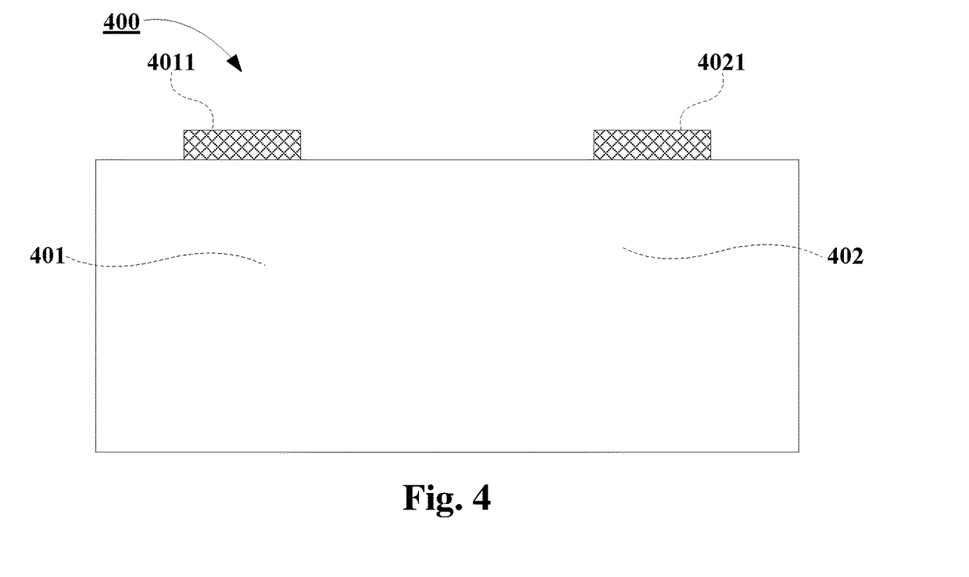
FIG. 4 is a diagram which shows a schematic illustration of a cross-section of a semiconductor wafer 400 in accordance with an embodiment of the present disclosure.

FIG. 4 is a diagram which shows a schematic illustration of a cross-section of a semiconductor wafer 400 in accordance with an embodiment of the present disclosure. As shown in FIG. 4, the semiconductor wafer 400 includes a first device 4011 and a second device 4021. The first device 4011 is included in a first semiconductor component 401 and the second device 4021 is included in a second semiconductor component 402.

Block 302, forming a trench within the semiconductor wafer and between the first device and the second device.

Figure 5:
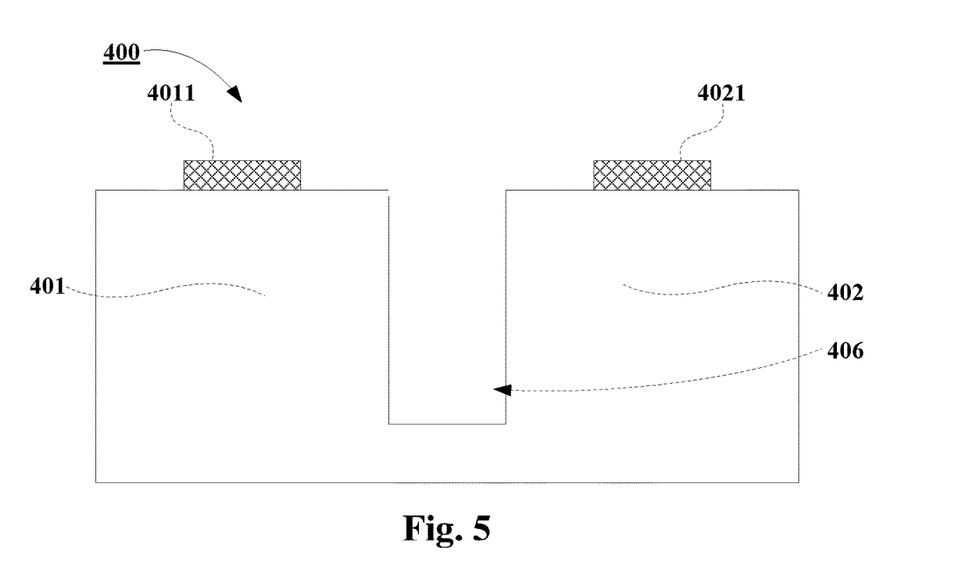
FIG. 5 is another diagram which shows a schematic illustration of a cross-section of a semiconductor wafer 400 in accordance with an embodiment of the present disclosure.

FIG. 5 is another diagram which shows a schematic illustration of a cross-section of a semiconductor wafer 400 in accordance with an embodiment of the present disclosure. As shown in FIG. 5, a trench 406 is formed within the semiconductor wafer 400 and between the first device 4011 and the second device 4021.

Block 303, forming a grind layer within the trench and on or adjacent to a backside of the semiconductor wafer; and Block 304, forming an insulation layer within the trench and on the grind layer.

Figure 6:
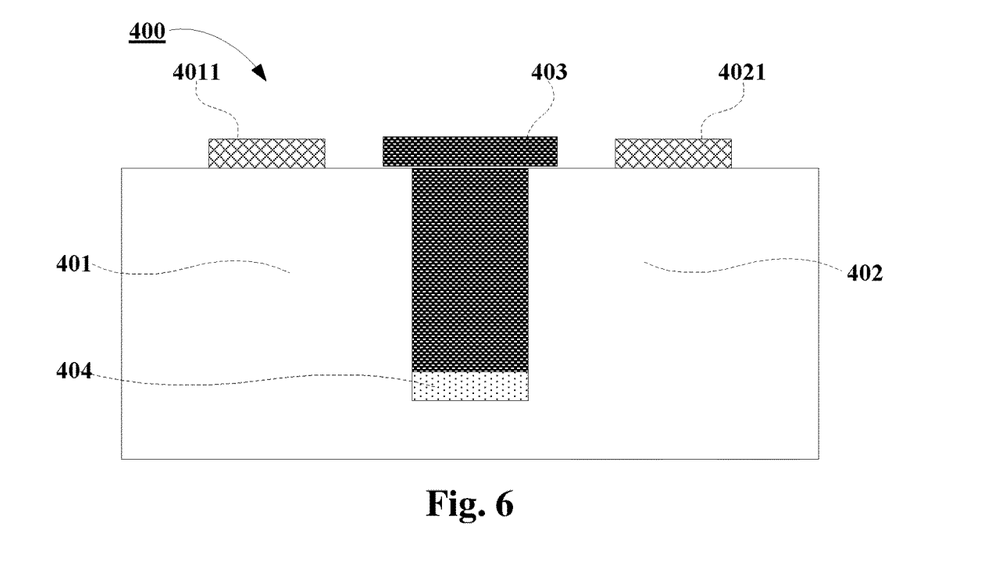
FIG. 6 is another diagram which shows a schematic illustration of a cross-section of a semiconductor wafer 400 in accordance with an embodiment of the present disclosure.

FIG. 6 is another diagram which shows a schematic illustration of a cross-section of a semiconductor wafer 400 in accordance with an embodiment of the present disclosure. As shown in FIG. 6, a grind layer 404 is formed within the trench 406 and on or adjacent to a backside of the semiconductor wafer 400; and an insulation layer 403 is formed within the trench 406 and is on the grind layer 404.

As shown in FIG. 3, the method 300 may further include:

Block 305, thinning the semiconductor wafer from the backside to expose the grind layer in the trench to form a first semiconductor component including the first device and a second semiconductor component including the second device.

Figure 7:
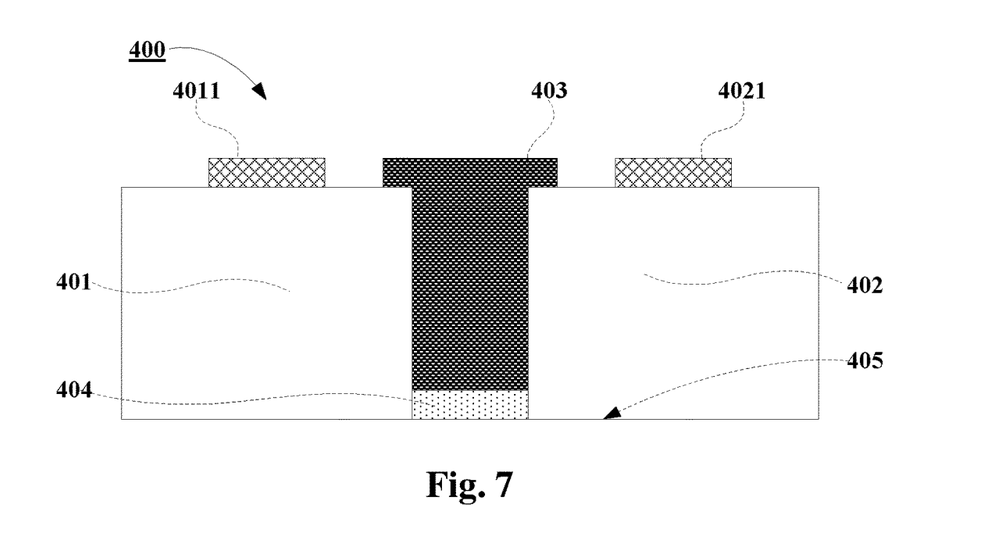
FIG. 7 is another diagram which shows a schematic illustration of a cross-section of a semiconductor wafer 400 in accordance with an embodiment of the present disclosure.

FIG. 7 is another diagram which shows a schematic illustration of a cross-section of a semiconductor wafer 400 in accordance with an embodiment of the present disclosure. As shown in FIG. 7, the grind layer 404 is exposed on a backside 405 of the semiconductor wafer 400 after the thinning process.

In this disclosure, material of the grind layer 404 is softer than the material of the first device 4011 and/or the second device 4021. For example, the grind layer 404 may include polycrystalline material of the first device 4011 and/or the second device 4021.

As one example, the first device 4011 and/or the second device 4021 include silicon, and the grind layer 404 includes polycrystalline silicon (Poly-Si). As another example, the first device 4011 and/or the second device 4021 include silicon carbide, and the grind layer 404 includes polycrystalline silicon carbide (Poly-SiC). However, the material of the grind layer 404 is not limited thereto.

Therefore, the grind layer has the substantially same material as the semiconductor device/component. chipping or cracking can be decreased or avoided when the grind layer 104 is exposed during the thinning process (such as backside grinding).

Furthermore, compared to the semiconductor wafer with the dielectric skeleton structure, grinding speed may not be different for the grind layer and the semiconductor component, such that better buffering can be provided and the semiconductor device may not be affected.

As shown in FIG. 3, the method 300 may further include:

Block 306, providing a backside metallization layer under the semiconductor wafer.

As shown in FIG. 3, the method 300 may further include:

Block 307, providing a dicing tape under the semiconductor wafer.

Figure 8:
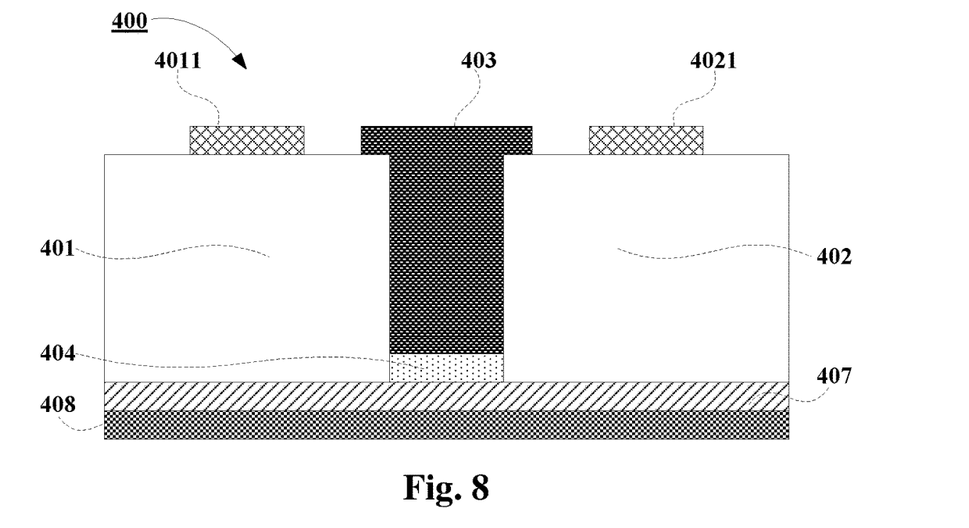
FIG. 8 is another diagram which shows a schematic illustration of a cross-section of a semiconductor wafer 400 in accordance with an embodiment of the present disclosure.

FIG. 8 is another diagram which shows a schematic illustration of a cross-section of a semiconductor wafer 400 in accordance with an embodiment of the present disclosure.

As shown in FIG. 8, a backside metallization layer 407 and a dicing tape 408 are provided under the semiconductor wafer 400.

Therefore, mechanical support and stabilization can be provided by the insulation layer 403, the backside metallization layer 407 and the dicing tape 408 for the semiconductor wafer 400.

As shown in FIG. 3, the method 300 may further include:

Block 308, cutting through the insulation layer and the grind layer to separate the first semiconductor component and the second semiconductor component.

Figure 9:
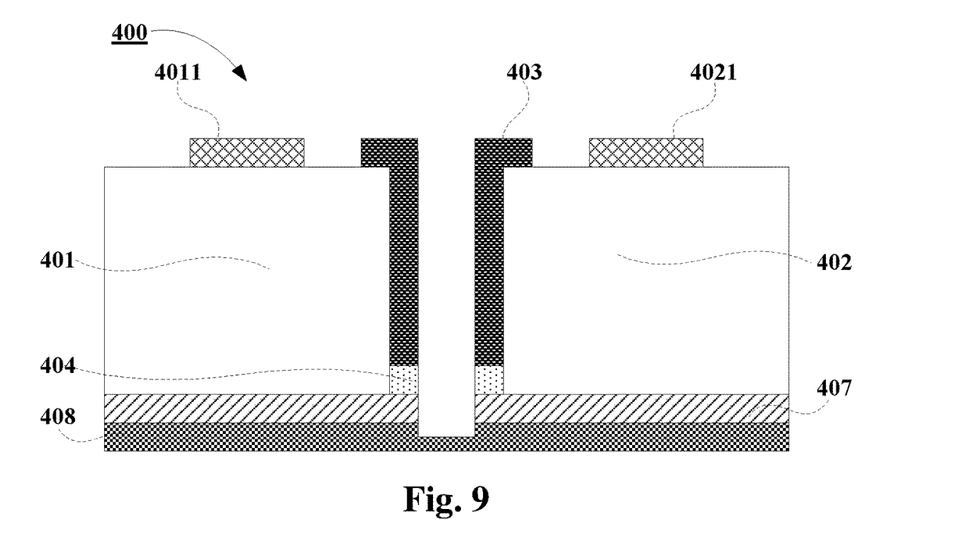
FIG. 9 is another diagram which shows a schematic illustration of a cross-section of a semiconductor wafer 400 in accordance with an embodiment of the present disclosure.

FIG. 9 is another diagram which shows a schematic illustration of a cross-section of a semiconductor wafer 400 in accordance with an embodiment of the present disclosure. As shown in FIG. 9, the insulation layer 403 and the grind layer 404 are cut through; and the first semiconductor component 401 and the second semiconductor component 402 are separated (or singulated).

It should be appreciated that FIG. 3 is only an example of the disclosure, but it is not limited thereto. For example, the order of operations at blocks may be adjusted, and/or, some blocks or steps may be omitted. Moreover, some blocks or steps not shown in FIG. 3 may be added.

As can be seen from the above embodiments, a grind layer is configured on or adjacent to a backside of the semiconductor wafer; and the grind layer contacts a first sidewall of the first semiconductor component and a second sidewall of the second semiconductor component. Therefore, chipping or cracking can be decreased or avoided when the grind layer is exposed during the thinning process (such as backside grinding).

Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device.

While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous.

Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A semiconductor wafer, comprising:
    a first semiconductor component having a first device;
    a second semiconductor component having a second device;
    an insulation layer laterally extending to the first semiconductor component and the second semiconductor component;
    a grind layer configured on or adjacent to a backside of the semiconductor wafer; wherein the grind layer contacts a first sidewall of the first semiconductor component and a second sidewall of the second semiconductor component; and
    a backside metallization layer situated under the semiconductor wafer.

2. The semiconductor wafer according to the claim 1, wherein the insulation layer covers at least part of the first sidewall of the first semiconductor component and at least part of the second sidewall of the second semiconductor component.

3. The semiconductor wafer according to the claim 1, wherein the semiconductor wafer further comprises:
    a trench formed between the first semiconductor component and the second semiconductor component; wherein the grind layer and at least part of the insulation layer are configured in the trench.

4. The semiconductor wafer according to the claim 1, wherein material of the grind layer is softer than the material of the first semiconductor component and/or the second semiconductor component.

5. The semiconductor wafer according to the claim 1, wherein the grind layer comprises polycrystalline material of the first semiconductor component and/or the second semiconductor component.

6. The semiconductor wafer according to the claim 5, wherein the first semiconductor component and/or the second semiconductor component comprise silicon, and the grind layer comprises polycrystalline silicon.

7. The semiconductor wafer according to the claim 5, wherein the first semiconductor component and/or the second semiconductor component comprise silicon carbide, and the grind layer comprises polycrystalline silicon carbide.

8. A semiconductor device, comprising:
    a semiconductor body;
    a grind layer formed on a bottom part of a first sidewall of the semiconductor body; and
    an insulation layer formed on another part of the first sidewall of the semiconductor body;
    wherein the grind layer and the insulation layer surround the periphery of the semiconductor body.

9. A method for forming a semiconductor, comprising:
    fabricating a plurality of devices comprising a first device and a second device in a semiconductor wafer;
    forming a trench within the semiconductor wafer and between the first device and the second device;
    forming a grind layer within the trench and on or adjacent to a backside of the semiconductor wafer;
    forming an insulation layer within the trench and on the grind layer;
    thinning the semiconductor wafer from the backside to expose the grind layer in the trench to form a first semiconductor component comprising the first device and a second semiconductor component comprising the second device; and
    providing a backside metallization layer under the semiconductor wafer.

10. The method according to the claim 9, wherein the method further comprises:
    providing a dicing tape under the semiconductor wafer.

11. The method according to the claim 10, wherein the method further comprises:
    cutting through the insulation layer and the grind layer to separate the first semiconductor component and the second semiconductor component.

12. The method according to the claim 9, wherein material of the grind layer is softer than the material of the first semiconductor component and/or the second semiconductor component.

13. The method according to the claim 9, wherein the grind layer comprises polycrystalline material of the first semiconductor component and/or the second semiconductor component.

14. The method according to the claim 13, wherein the first semiconductor component and/or the second semiconductor component comprise silicon, and the grind layer comprises polycrystalline silicon.

15. The method according to the claim 13, wherein the first semiconductor component and/or the second semiconductor component comprise silicon carbide, and the grind layer comprises polycrystalline silicon carbide.

16. The method according to the claim 9, wherein the insulation layer comprises at least one of silicon dioxide and silicon nitride.

* * * * *